US007449976B1

(12) United States Patent
Waslo

(10) Patent No.: US 7,449,976 B1
(45) Date of Patent: Nov. 11, 2008

(54) POWER EFFICIENT PIN ATTENUATOR DRIVE CIRCUIT

(75) Inventor: George W. Waslo, Liberty Township, OH (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 11 days.

(21) Appl. No.: 11/686,817

(22) Filed: Mar. 15, 2007

(51) Int. Cl.
*H01P 1/22* (2006.01)

(52) U.S. Cl. ..................... 333/81 R; 327/308
(58) Field of Classification Search ............... 333/81 R; 327/308, 309
See application file for complete search history.

(56) References Cited

U.S. PATENT DOCUMENTS

| 4,236,126 | A | 11/1980 | Weller et al. |
|---|---|---|---|
| 4,494,084 | A | 1/1985 | Hughes |
| 4,912,394 | A * | 3/1990 | Sugimoto et al. ........... 323/354 |
| 5,847,624 | A | 12/1998 | Pritchett |
| 6,011,513 | A | 1/2000 | Wilson et al. |
| 6,147,568 | A | 11/2000 | Souetinov |
| 6,472,948 | B1 | 10/2002 | Kyriakos et al. |
| 6,667,669 | B2 | 12/2003 | Goyette et al. |
| 6,683,511 | B2 | 1/2004 | Souetinov et al. |
| 6,919,774 | B2 | 7/2005 | Ritchey et al. |
| 7,002,391 | B1 | 2/2006 | Madsen |
| 7,023,294 | B2 | 4/2006 | Hauger et al. |
| 2005/0093606 | A1 | 5/2005 | Kaiser, Jr. |
| 2005/0156685 | A1 | 7/2005 | Hauger et al. |
| 2005/0174157 | A1 | 8/2005 | Calo' et al. |
| 2006/0028291 | A1 | 2/2006 | Endo et al. |
| 2006/0044040 | A1 | 3/2006 | Kawai |
| 2006/0097821 | A1 | 5/2006 | Ju et al. |

* cited by examiner

*Primary Examiner*—Stephen E Jones
(74) *Attorney, Agent, or Firm*—Marsteller & Associates, P.C.

(57) ABSTRACT

An attenuator circuit (10) having two or more branch circuits (12a to 12e) has inputs (14a to 14e) for the branch circuits (12a to 12e) being connected essentially in parallel arrangement to an input port (20) for the attenuator circuit (10). Each branch circuit (12a to 12e) includes one or more bipolar transistors (32a to 32e) having a collector element receiving a signal from a power supply (24) through at least one RF positive-intrinsic-negative (PIN) diode (50a-50d) that a control circuit (24) is controlling. At least one resistive element (16a) couples an input (14b) of a second (12b) of the plurality of branch circuits (12a to 12e) from the input port (20) to the branch circuits (12a to 12e). Thus, each branch (12a to 12e) of the attenuator circuit (10) draws current from a low voltage power supply (24) while still providing for sequential biasing of successive branches and linearization of overall control characteristics.

10 Claims, 6 Drawing Sheets

POWER EFFICIENT PIN ATTENUATOR DRIVE CIRCUIT

BACKGROUND OF THE INVENTION

1. Technical Field

The invention relates to the field of attenuators, and more particularly to radio frequency attenuators.

2. Background Art

Interference Canceller Systems (ICS) have been produced for use on military platforms. This kind of system, also known as a "phase canceller," operates by obtaining a radio-frequency (RF) sample of an interfering source and summing it, precisely weighted in magnitude and phase, into the received path to cancel the received interference, leaving the signal(s) of interest.

A fundamental block or element in the circuitry in this system is a vector modulator, also known as a "weight circuit." The weight circuit uses several networks each consisting of positive-intrinsic-negative (PIN) attenuator diodes, couplers, resistors and nonlinear DC drive circuitry to form a voltage variable resistance element capable of handling moderate RF input power levels. The resistance element creates a reflected signal that continuously covers the range of in-phase (positive reflection coefficient), inverted (negative reflection coefficient) or zero. A PIN diode is a current controlled device, in which the RF resistance is a function of the forward DC current PIN diodes are reasonably low in RF distortion production when driven with moderate to high DC currents, or when subjected to low RF currents. But they can have considerate RF nonlinearities and create distortion when subjected to moderate to high RF currents and low DC control currents.

For use in an ICS system, the control law of the weight circuit element must provide at its output reasonably linear control scaling of the applied RF voltage relative to the control voltages, while sequentially driving the branches of diodes and resistors so that they remain within conditions of applied RF and DC that result in acceptable output distortion levels.

The driving circuit of the weight network of existing systems (FIG. 1) uses a single power MOSFET and a chain of rectifier diodes and resistors to provide the current sequencing into the branches and to obtain an approximately linear control characteristic.

Consider a continuously rising control voltage that is to result in a variable RF impedance at the port "RF In/Out". When the MOSFET current is cut off, all PIN diodes are in a high RF impedance state, which is coupled by the transformer to the port. As the MOSFET begins to conduct, first the PIN diodes in the first (bottom, with resistors "A") branch begin conducting DC current and drop in RF resistance. Higher branches will not begin to conduct until the voltage at the MOSFET drain has fallen a sufficient number of diode drops below the +V supply to create a forward voltage across the PIN diodes of each branch. As MOSFET current increases further and when the resistance of the first branch becomes limited by the value of the fixed resistors ("A"), the PIN diodes in the next higher branch begin to conduct and the resistance of this second branch begins dropping. With increasing MOSFET current, the pattern continues with each branch successively conducting until the PIN diodes in the top branch are driven to their minimum RF resistance, where the total network resistance then consists of all branches in parallel at their minimum resistances. A nonlinear network provides degeneration to the source terminal of the MOSFET to approximate a linear control characteristic (of reflection coefficient versus control voltage).

A serious deficiency of such a previously known scheme is that a large portion of the DC power used by the network is consumed by the rectifier diodes and in driving earlier sequenced PIN diodes with more current than is useful to further control the PIN diodes. The drop across each diode of the network is on the order of one volt, yet the current for every PIN diode pair derives from the approximately 12V power supply. Under conditions giving the lowest network RF resistance (all PIN diodes fully conducting), only a small portion of the DC power dissipation is in the PIN diodes. As the control voltage increases, current drawn by all activated branches will continue to increase, limited eventually by the supply voltage at rather high maximum power dissipation.

In addition, the use of a MOSFET leads to possible production problems, as the turn-on voltage of MOSFETS is not well controlled from one batch or sample to anther. For large scale production, this would require part selection or inclusion of the MOSFET within a feedback loop of an operational amplifier to provide control consistency.

The circuitry of the present invention provides a means for each branch of the attenuator to draw current from a lower voltage power supply, while still providing for sequenced biasing of the successive branches and linearization of the overall control characteristic, and by using small, inexpensive bipolar transistors to provide improved repeatability in manufacture.

While the above cited references introduce and disclose a number of noteworthy advances and technological improvements within the art, none completely fulfills the specific objectives achieved by this invention.

DISCLOSURE OF INVENTION

In accordance with the present invention, a drive circuit for a PIN diode continuously adjustable passive RF attenuator network is used in interference canceller systems or other applications requiring low distortion high dynamic range analog control of moderate power RF signals. The present circuit provides a significant reduction in DC power consumption with capability to individually optimize the active control voltage range, control slope, and a limiting current for each diode-resistor branch of the attenuator. The ability to control these parameters allows for improved control linearity compared to previous schemes.

These and other objects, advantages and preferred features of this invention will be apparent from the following description taken with reference to the accompanying drawings, wherein is shown the preferred embodiments of the invention.

BRIEF DESCRIPTION OF DRAWINGS

A more particular description of the invention briefly summarized above is available from the exemplary embodiments illustrated in the drawing and discussed in further detail below. Through this reference, it can be seen how the above cited features, as well as others that will become apparent, are obtained and can be understood in detail. The drawings nevertheless illustrate only typical, preferred embodiments of the invention and are not to be considered limiting of its scope as the invention may admit to other equally effective embodiments.

MODE(S) FOR CARRYING OUT THE INVENTION

Figure 1:
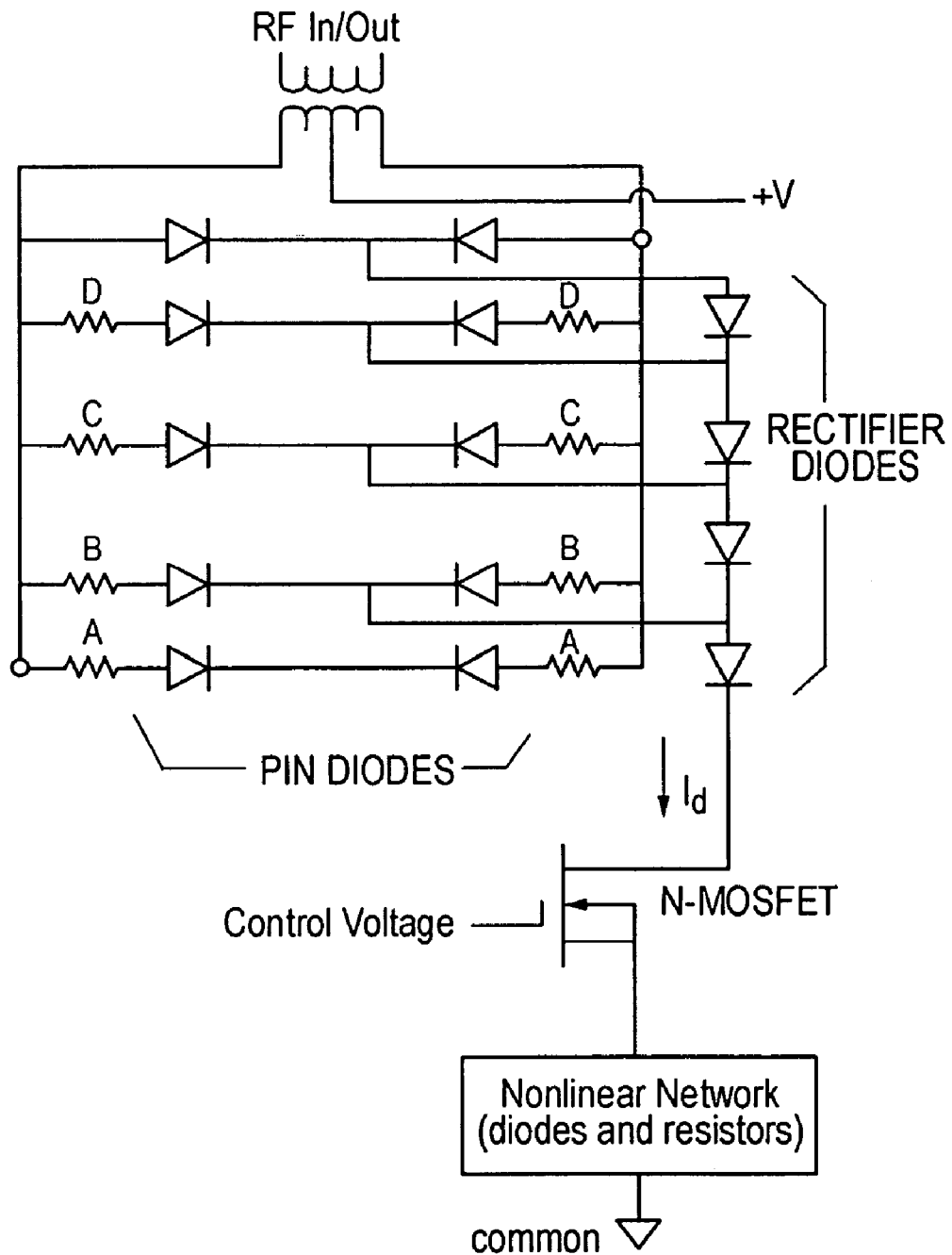
FIG. 1 is a schematic diagram for a driving circuit of a weight network in a prior art system.

So that the manner in which the above recited features, advantages and objects of the present invention are attained can be understood in detail, more particular description of the invention, briefly summarized above, may be had by reference to the embodiment thereof that is illustrated in the appended drawings. In all the drawings, identical numbers represent the same elements.

The present invention includes a drive circuit for a PIN diode continuously adjustable passive RF attenuator network for use in interference canceller systems or other applications requiring low distortion high dynamic range analog control of moderate power RF signals. The circuit provides a significant reduction in DC power consumption with capability to individually optimize the active control voltage range, control slope, and a limiting current for each diode-resistor branch of the attenuator. The ability to control these parameters allows for improved control linearity compared to previous schemes.

An attenuator circuit 10 having two or more branch circuits 12a to 12e has inputs 14a to 14e for the branch circuits 12a to 12e being connected essentially in parallel arrangement to a control input port 20 for a control voltage signal 18 for the attenuator circuit 10. Each branch circuit 12a to 12e includes one or more bipolar transistors 32a to 32e having a collector element receiving a signal from a control circuit of a power supply circuit section 24 through at least one RF positive-intrinsic-negative (PIN) diode 50a-50d that the power supply 24 is controlling. At least one resistive element 16a couples an input 14b of a second 12b of the plurality of branch circuits 12a to 12e from the input connection or control input port 20 to the branch circuits 12a to 12e. Thus, each branch 12a to 12e of the attenuator circuit 10 draws current from a low voltage power supply control circuit 24 to minimize DC power consumption while still providing for sequenced biasing of successive branches and linearization of overall control characteristics.

The design of the present invention 10 (see FIG. 2) uses separate low power bipolar transistor stages 12a through 12e to provide control for the separate legs of the network. The emitter of the transistors 32a through 32e for each stage 12a through 12e draw diode current signals 22a through 22e from a low voltage power supply 24, rather than from a steering diode network from a higher voltage power supply as was previously used.

The inputs (to the base connection) 14a through 14e of the individual stages 12a through 12e are driven from a chain of resistive elements 16a through 16d, such as discrete resistors, feeding a current sink 28, which provides a series of voltages that are successively offset below the overall input control voltage signal 18 at the input point or feed 20. The cut-in control voltage 30a through 30e for each stage 12a through 12e, respectively, can be adjusted via the resistance values of the resistors 16a through 16d in the chain.

Resistive elements or discrete resistors 26a through 26e coupled in the emitter circuit of each "leg" network 12a through 12e determine the slope of the current versus voltage characteristic for that leg 12a through 12e. The legs can also use multiple transistors (such as transistors 32a and 32d in "leg 4" 12d and transistors 32e, 32e1 and 32e2 in "leg 5" 12e in the schematic diagram of FIG. 2) to provide a control that changes slope in several segments for a leg, or to provide higher current as needed.

Each stage 12a through 12e will go into current limiting when the total voltage dropped across the emitter resistors 26a through 26e and the leg network (PIN diodes and resistors) approaches the supply voltage and the transistor stage saturates. Each leg 12a through 12e has one or more resistors 44 in the RF section 46 that are coupled in series with inputs to legs 12a through 12e and such resistive elements 44 can be independently adjusted for the required limit, independent of the slope, so as to not waste supply current when lower total RF resistances are needed. Series resistors 34a through 34d in the base circuits prevent the saturated transistors 32a through 32e from significantly altering the voltage step levels created by the current sink $I_{sink}$ 28.

The optimization of the network 10 of the present invention is best performed using a computer model which simulates the current drain of each stage 12a through 12e along with the third RF harmonic distortion expected from the overall network and the shape of the control characteristic.

As the control input voltage increases from zero, the transistor 32a driving leg1 12a will first begin to conduct. The transistors 32b through 32e driving the other stages 12b through 12e will not yet be conducting, as their base emitter junctions will be reverse biased by the voltage drops that exit across the chain of resistors 16a through 16d that run between the control input terminal 20 and a constant current sink 28. These voltage drops are generated by the very low $I_{sink}$ current drawn by the current sink 28, and serve to keep the drive for each stage 12a through 12e at successive voltage steps below the control input signal 18. Bipolar transistors were preferred over FETS because of their extremely consistent input turn-on voltage characteristic.

Figure 2:
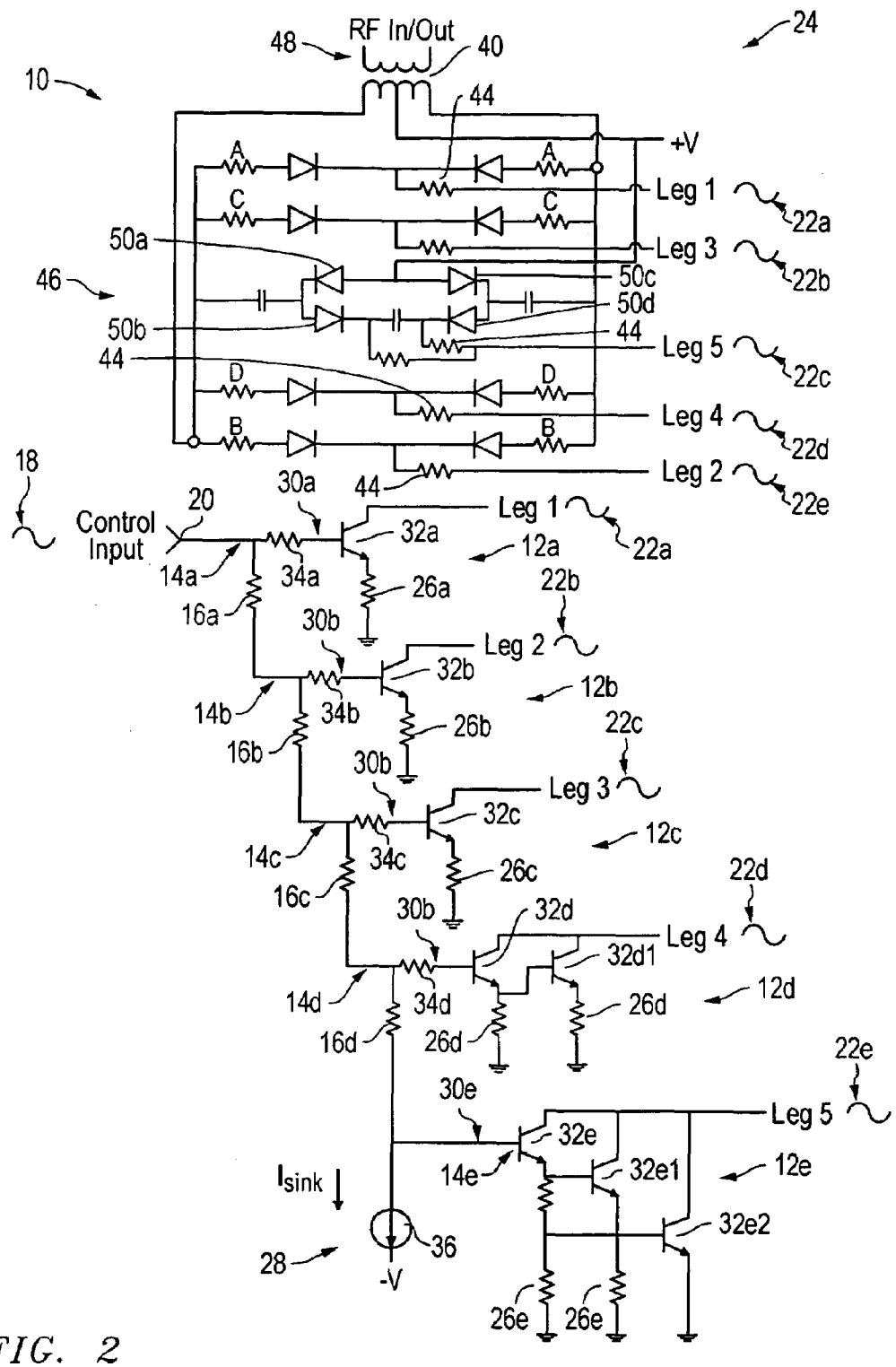
FIG. 2 is a schematic diagram for a weight network of the present invention.
Figure 3:
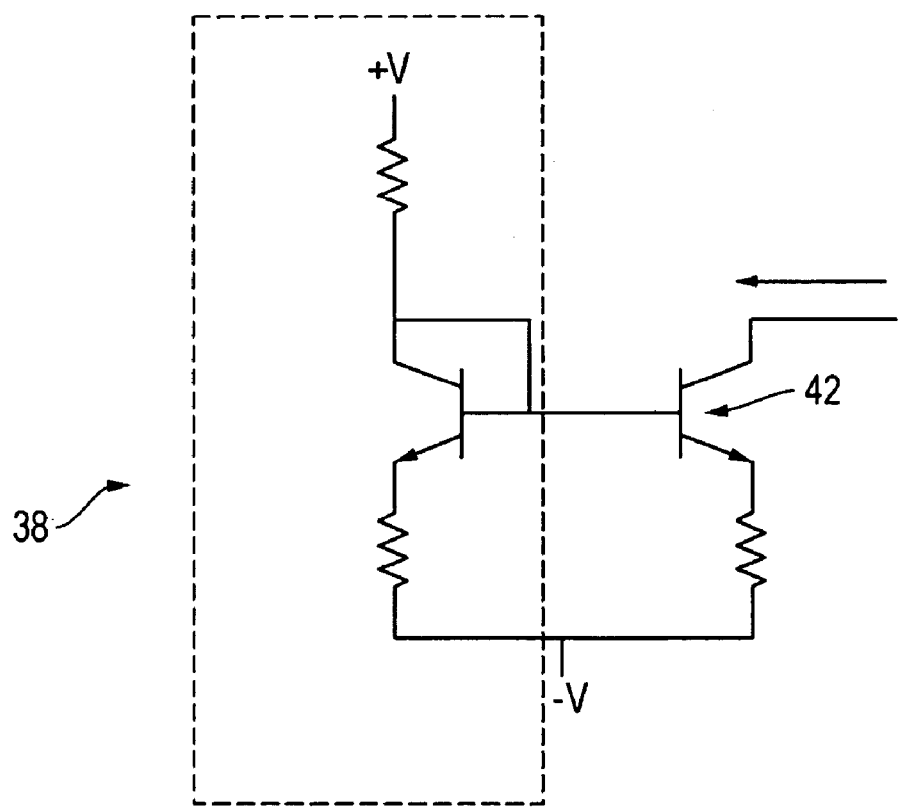
FIG. 3 is a schematic diagram for a possible implementation for the current sink used in the present invention.

With particular reference to FIG. 3, a detail of one commonly used way to make a current sink 28 is shown. The schematic of FIG. 2 may be intended for use in the VHF and UHF bands (30MHz to 400MHz) though the same type of circuitry may be done for other frequency bands. The transformer 40 shown in FIG. 2 may be a 1:1 center tapped RF transformer appropriate for the chosen band power level.

RF power applied to the 50 ohm "RF In/Out" port 48 will be reflected back out at a magnitude and polarity controlled by the Control Input voltage signal 18. Typically, two of these circuits 10 may be used to control a signal, with either quadrature hybrid or 180-degree hybrid couplers used to separate the forward and reflected signals and to provide a good RF match for driving RF circuitry. A full vector IQ modulator, for instance, may require four of these circuits.

Additional improvements are made to the RF leg circuitry 38 in this embodiment shown in FIG. 2. The minimum resistance that can be achieved by the weight element is determined by the minimum PIN diode resistance achievable in the last highest current leg ("leg 5" 22e in FIG. 2). The DC current in the last stage 22e, when it is active, is typically sufficient to avoid excessive distortion, so four PIN diodes 50a through 50d in the RF section 46 are instead used in series-parallel (rather than two PIN diodes in series) here to provide a lower ultimate resistance value. This allows for approximately 0.5 dB lower overall insertion loss at minimum inverted attenuation for the network in the example circuit.

Not shown in the figures is another option in which each PIN diode can be simply replaced by two series connected PIN diodes of the same type. Analysis suggests than this arrangement can provide a third-harmonic distortion reduction for worst case conditions of approximately 12 dB, or 4 dB improved power handling while using the same form and topology of control circuit.

Figure 4:
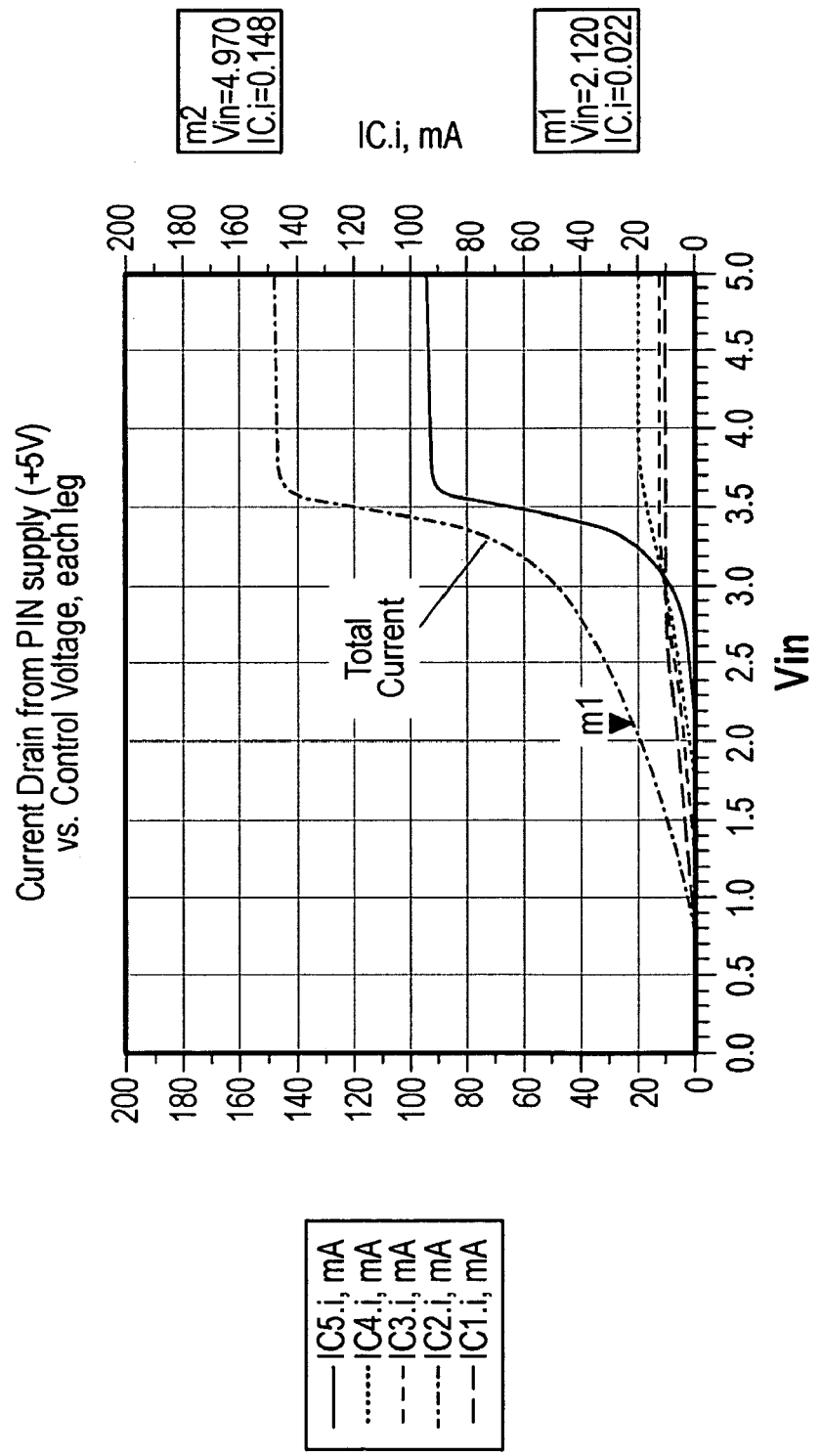
FIGS. 4 through 6 are charts depicting performance of a weight circuit of the present invention.
Figure 5:
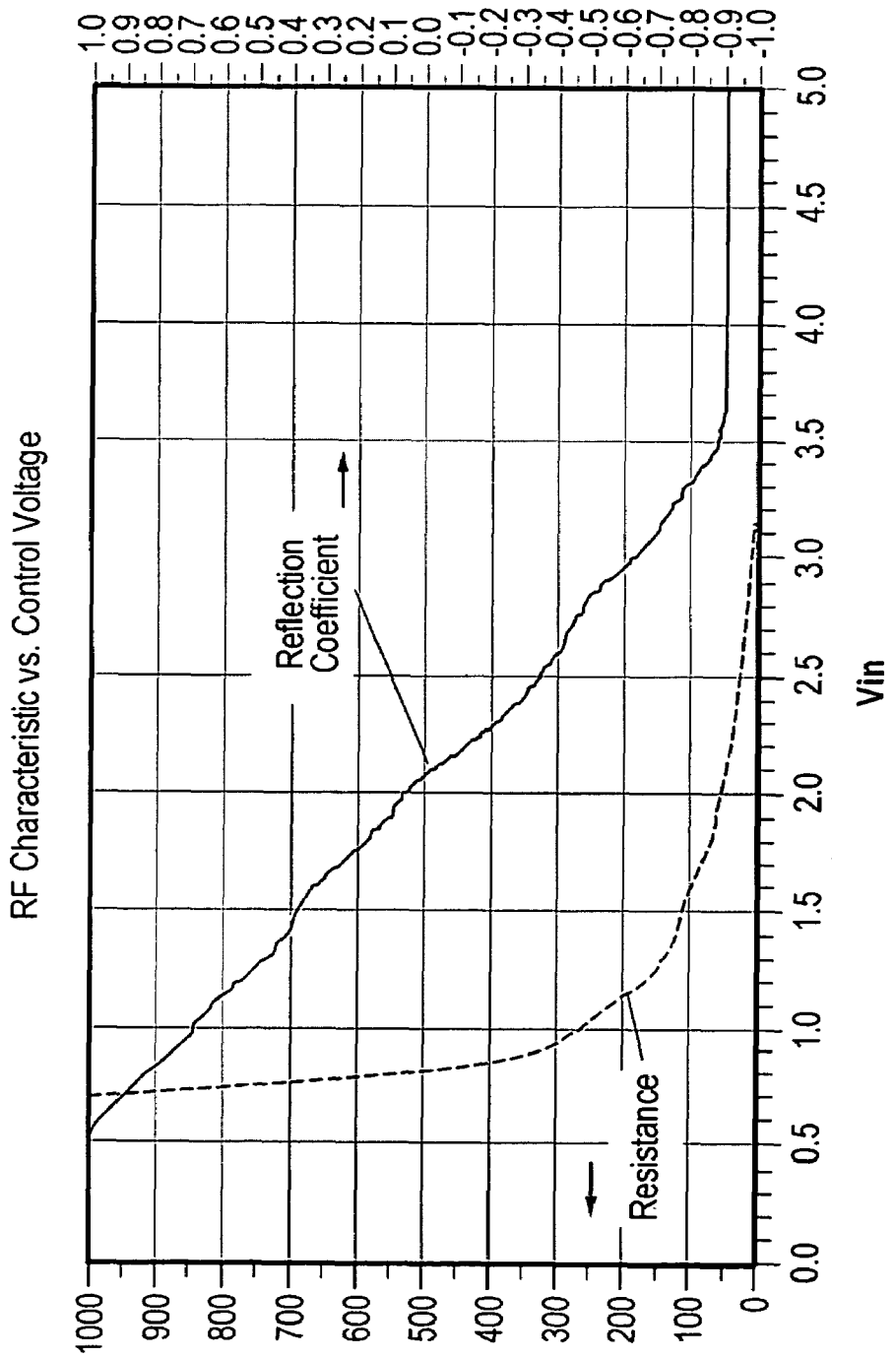
Figure 6:
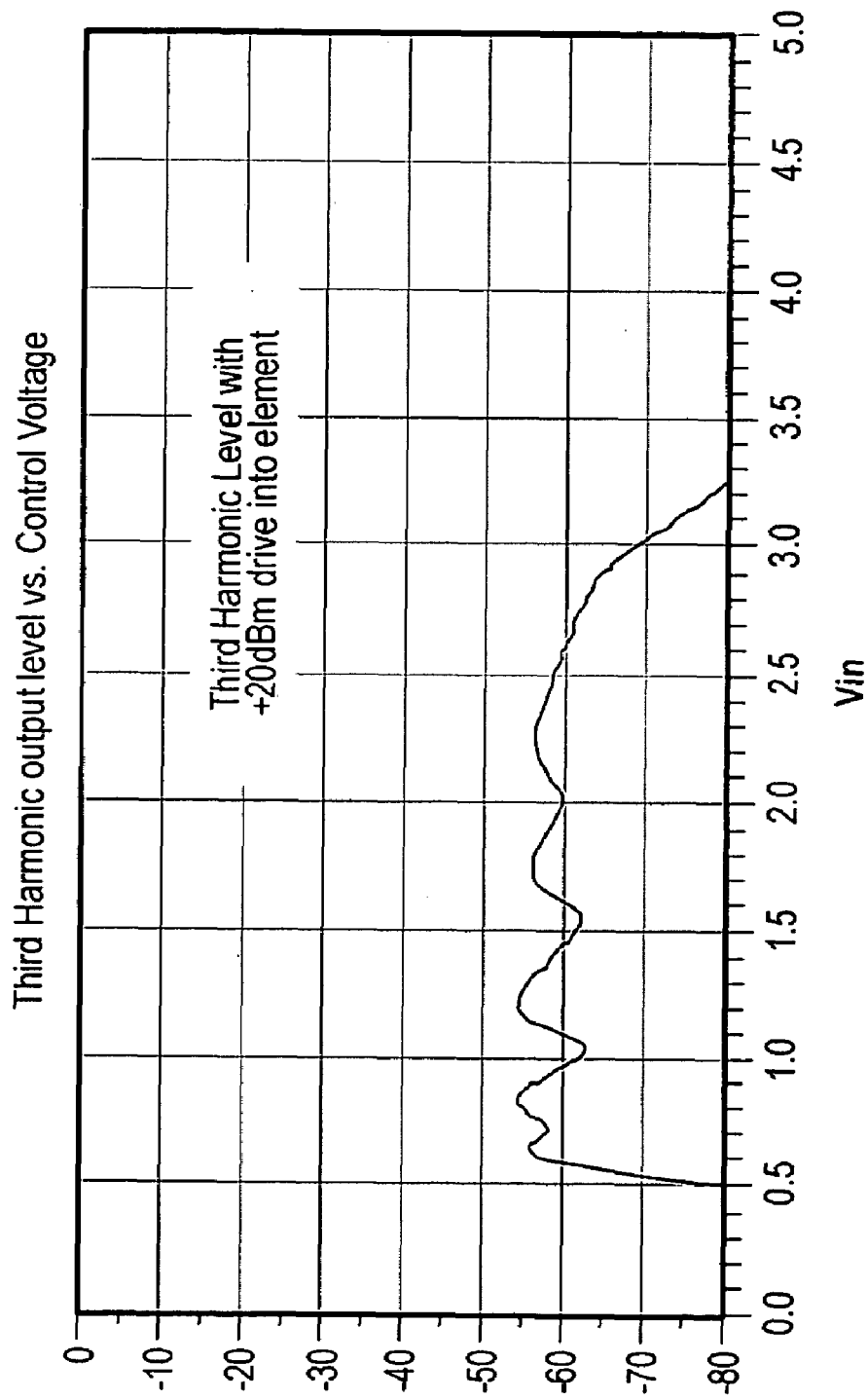

FIG. 4 shows the simulated leg currents. FIG. 5 shows the control characteristics, and FIG. 6 shows the third harmonic distortion output (for +20 dBm input to the element) for the described embodiment shown in FIGS. 2 and 3 of the new weight circuit. As can be seen in the current drain graph (FIG. 4, top), the current of each stage, identified as IC1 . . . IC5, limits after its useful voltage control range has been exceeded. The results shown in FIGS. 4-6 are for the described embodiment after optimizing component values for overall linearity and best worst-case distortion and indicate projected performance equal to or exceeding that of the previously known circuitry.

DC power consumption of a weight circuit such as the present invention 10 is a function of the instantaneous control voltage, but thermal and power supply designs must accommodate the worst case. Both the worst-case and the minimum operating currents are greatly improved over those of the legacy circuit, as shown in Table 1 as follows.

TABLE 1

DC Power consumption comparison

|  | Prior Art Circuitry | Circuitry of the Present invention | Power Reduction |
| --- | --- | --- | --- |
| Worst Case | 13.8 W | 1.6 W | 88% |
| Minimum Operating | 2.8 W | 0.5 W | 82% |

The foregoing disclosure and description of the invention are illustrative and explanatory thereof, and various changes in the size, shape and materials, as well as in the details of the illustrated construction may be made without departing from the spirit of the invention.

The invention claimed is:

1. An attenuator control circuit having two or more branch circuits comprising:
    inputs for the branch circuits being connected essentially in parallel arrangement to an input port for the attenuator circuit;
    each branch circuit includes one or more transistors receiving a signal from a power supply through at least one RF positive-intrinsic-negative (PIN) diodes that a control circuit is controlling; and,
    at least one resistive element couples an input of a second of the plurality of branch circuits from the input port to the branch circuits;
    whereby each branch of the attenuator circuit draws current from a low voltage power supply to minimize DC power consumption while still providing for sequenced biasing of successive branches and linearization of overall control characteristics.

2. The invention of claim 1 wherein the transistors are of a bipolar type.

3. The invention of claim 1 wherein the resistance element is a discrete resistor.

4. The invention of claim 1 wherein the input port is coupled to a current sink element through a chain of series connected resistive elements.

5. The invention of claim 1 further including resistive elements coupled in emitter circuits of the transistor in one or more branches.

6. A method for providing for sequenced biasing of successive branches and linearization of overall control characteristics in an attenuator circuit comprising:
    providing an input signal through an input port to a plurality of branch circuits being connected essentially in parallel arrangement, each branch circuit includes one or more transistors receiving a signal from a power supply through at least one RF positive-intrinsic-negative (PIN) diodes that a control circuit is controlling; and,
    coupling the input port to an input of a second of the plurality of branch circuits through at least one resistive element.

7. The method of claim 6 wherein the transistors are of a bipolar type.

8. The method of claim 6 wherein the resistive element is a discrete resistor.

9. The method of claim 6 wherein the input port is coupled to a current sink element through a chain of series connected resistive elements.

10. The method of claim 6 further including resistive elements coupled in emitter circuits of the transistor in one or more branches.

* * * * *